United States Patent [19]

Piekenbrock

[11] Patent Number: 4,656,666

[45] Date of Patent: Apr. 7, 1987

[54] METHOD AND APPARATUS FOR HANDLING INFORMATION

[76] Inventor: Lawrence J. Piekenbrock, 1437 Pearl St., Boulder, Colo. 80302

[21] Appl. No.: 80,236

[22] Filed: Oct. 1, 1979

[51] Int. Cl.⁴ .................. G11C 21/00; H04B 7/185
[52] U.S. Cl. .................................. 455/12; 365/73; 342/44
[58] Field of Search ............... 455/12, 7, 13, 24, 73, 455/71, 11, 12; 343/65 R, 7 R, 100 ST; 370/32, 86, 87, 88; 375/3, 107, 108, 109; 371/33, 34, 41; 235/152; 365/73, 76, 106, 129, 244; 333/29

[56] References Cited

U.S. PATENT DOCUMENTS

| | | | |
|---|---|---|---|
| 2,467,299 | 4/1949 | Espenschied | 455/13 |
| 2,542,823 | 2/1951 | Lyle | 455/11 |
| 2,626,352 | 1/1953 | Alvarez | 328/109 |
| 2,891,723 | 6/1959 | Newman | 235/152 |
| 3,078,443 | 2/1963 | Rose | 371/41 |
| 3,144,606 | 8/1964 | Adams | 343/100 ST |
| 3,150,324 | 9/1964 | Hallden | 328/56 |
| 3,187,308 | 6/1965 | Frankel | 365/73 |
| 3,243,706 | 3/1966 | Grisham | 455/12 |
| 3,471,856 | 10/1969 | Laughlin | 455/12 |
| 3,624,650 | 11/1971 | Paine | 345/100 ST |
| 3,667,044 | 5/1972 | Vaughan | 455/11 |
| 3,934,224 | 1/1976 | Dulaney | 371/34 |
| 4,004,098 | 1/1977 | Shimasaki | 455/13 |
| 4,019,138 | 4/1977 | Watanabe | 455/12 |

OTHER PUBLICATIONS

McClannan et al., "A Satellite System for CATV" Jul. 1970 by Proceeding of IEEE vol. 58, No. 7, pp. 987–1001.

*Primary Examiner*—Robert L. Griffin
*Assistant Examiner*—Stephen Chin

[57] ABSTRACT

A continuously-flowing loop of electromagnetic energy extends between Earth and an object in space. Information is both loaded into the loop and extracted therefrom. To these ends, a first transmitter may be located on Earth along with a first receiver. On the distant object, such as the Moon or a satellite, a second transmitter is located together with a second receiver. Electromagnetic radiation is directed from the first transmitter to the second receiver and from the second transmitter back to the first receiver. Information imposed on the radiation is coupled from the first receiver to the first transmitter and from the second receiver to the second transmitter. The receivers and transmitters together with the coupling means and propagation in space between Earth and the distant object establish the continuously-flowing loop of information. Included also is apparatus for entering information into the loop and apparatus for extracting information from the loop.

10 Claims, 5 Drawing Figures

METHOD AND APPARATUS FOR HANDLING INFORMATION

The invention pertains to a method and apparatus for handling information. More particularly, it relates to the mass storage of information on the time delay inherent in the propagation of electromagnetic radiation through air or free space.

Communication may be defined as the process of transmitting and receiving information. The two basic types of information which can be communicated are transient and stored. Transient information, such as a telephone conversation, is spontaneously generated at the time of transmission. Transient information not acted upon as received will be lost unless it is transformed into stored information. Most information is so transformed, if only into the mental storage of the recipient.

Technologically, there are many ways to store information. The particular storage method chosen may be determined by the character of the user, the number of users, the amount of information concerned, the length of time during which the information must be retained in storage and the speed with which the information must be made available to a user. One exemplary extreme is a library of printed books in which a tremendous amount of information is available to many users over a long period of time. At an opposite extreme could be a scratch pad memory in a computer which stores only a very small amount of data that is available only to that particular computer for less than one-millionth of a second. In the library, any user having access may get the information he desires, although it may take minutes, hours or much longer to gain actual possession of the information. In the computer, on the other hand, possession is almost immediate.

The degree of ease with which stored information may be accessed often has a direct bearing upon the usefulness of that information. Accordingly, much research has been directed toward the problem of accessing data. Historically, data has been stored serially or by position. In the library, books are assigned a number as determined by a classification system. Each book, thus encoded, is placed on the shelf in a position such that its assigned number is in the proper sequence. The numbering system allows room for future books. If a given book is not properly placed in the assigned sequence, it effectively is lost. Such a serial accessing system is essentially passive. The users do the active searching for a given code, and many users may search at the same time.

With the advent of electronic recording apparatus, it became possible to reduce access time. A user may enter the code of needed information into a machine, and any information, such as that recorded in digital form on a magnetic tape, is moved back and forth until the information code on the tape matches that on the user-entered code. While the access time is reduced for any one user, hardware limitations restrict access to one or only a few users at any given time. As in the library, physical movement of information is still required.

The electronic methods of storage have required that the information be retained in or on a tangible medium such as magnetic or paper tape, a disc, or a drum. That medium is then associated with other equipment in order to allow the user to gain access. Such storage on physical media involves the creation of another form of library which must be encoded just like the above-illustrated library of books.

The subsequent development of all-electronic storage brought forth the random access memory. Such a device has the ability to respond in a manner analogous to someone shouting "present" when his name is spoken at roll call. The random access memory is desirable in that there does not need to be any physical movement of the information from its place of storage. Nevertheless, the approach again is limited by the hardware required which permits access at any time to only one or a very few users.

In an effort to reduce the physical size of the electronic or magnetic library, much effort has been devoted to increasing the density at which the information is packed into the medium. Magnetic media can easily store twenty-thousand bits of information per lineal inch. Electronic memories can store approximately one-hundred-twenty-five-thousand bits of information on a piece of material in the form of a square that may measure only two or three millimeters on a side. Notwithstanding such tremendous improvement in information packing densities, the prior art has continued to rely upon the use of a physical medium for the recording or storing of data.

All modes of electronic data transmission inherently involve some degree of time delay. Usually, the delay is a bother. In attempting to design infinitely fast computing and data communication services, it is an objective to eliminate transmission delays as much as possible. Thus, system components are placed in close proximity and use is made of a high-speed data carrier, such as light, with a fast carrier medium such as a gas.

On the other hand, time delay present in the transmission of data by means of hardware has been used advantageously both for information storage and for data shifting. For example, U.S. Pat. No. 2,891,723-Newman et al uses an acoustic delay line. Its output is amplified, reshaped and fed back to an input transducer so as to develop a continuous pattern of pulse information which may be preserved indefinitely. That patent is believed to be representative of a variety of prior systems which use any of mechanical, tape, disc, drum and magnetostrictive devices for the purpose of achieving some kind of recirculating memory characteristic.

The different directions which have been taken with regard to the phenomena of time delay pose an interesting contrast. When addressing problems attendant to computing and data communication, the objective has been to minimize transmission delay, even to the extent of employing electromagnetic radiation such as light in a given data link. When seeking to take advantage of time delay for storage or other purposes, however, the approach in the art has been to use dense mediums and slow propagation velocities for the purpose of achieving a reasonably high packing density of bits of information.

Time delay also has been recognized as a problem necessary to be considered in connection with space communications. In U.S. Pat. No. 4,004,098-Shimasaki, for example, a system is disclosed which involves the use of a pair of satellite relays having a communication link between them. To maintain synchronization between the satellites, a designated reference station transmits a burst of unique words to the satellite within its field of view. That reference burst is relayed to the other satellite and back again to the first where it is returned to the reference station. Relative phase drift is detected and corrected. In addition, improper propagation delay is detected and adjustments are made for the purpose of compensation. It will be observed, accordingly, that the existence of propagation delay in space is recognized, although it is approached as a problem which must be resolved.

A general objective of the present invention is to provide a new and improved method of handling information in information storage systems.

Another objective of the present invention is to take advantage of the use of a high speed information carrier propagating in a high-velocity medium for the purpose of storing information.

A further objective of the present invention is to provide a new and improved method for the mass storage of information.

Still another objective of the present invention is to provide a new and improved information storage system fully capable of being implemented with state of the art apparatus and techniques.

It is yet another objective of the present invention to provide a new and improved method and system of information storage that requires no expenditure for the provision of a physical storage medium.

It also is an objective of the present invention to provide a new and improved information storage system that admits to access by means of any of a schedule, a command or on a random basis.

In accordance with one implementation of the present invention, a method of handling information involves the establishing of a continuously-flowing loop of electromagnetic energy extended between the planet Earth and an object separated therefrom by free space. Information to be handled is loaded into the loop. Information to be read out is extracted from the loop.

For the purpose of the storage of information, the system includes a first transmitter of information-carrying electromagnetic radiation located on a first object having a determinable position in space. A first receiver of the information is also located on that first object, and that information is coupled to the first transmitter. A second transmitter of information-carrying radiation is located on a second object having a determinable position in space removed from the first object by a distance creating substantial delay in propagation of the radiation through the space between the first and second objects. A second receiver of the radiation is also located on the second object. Radiation is directed from the first transmitter to the second receiver through the space and from the second transmitter to the first receiver. Additionally included are means for coupling information, imposed on the radiation arriving at the second receiver, to the second transmitter. The receivers and transmitters together with the coupling means and the propagation space between the objects establishes a continuously flowing loop of information. Completing the system are means for entering information into the loop and means for extracting information therefrom.

The features of the present invention which are believed to be patentable are set forth with particularity in the appended claims. The organization and manner of operation of the invention, together with further objectives and advantages thereof, may best be understood by reference to the following description taken in connection with the accompanying drawings, in the several figures of which like reference designations identify like elements, and in which:

Figure 1:
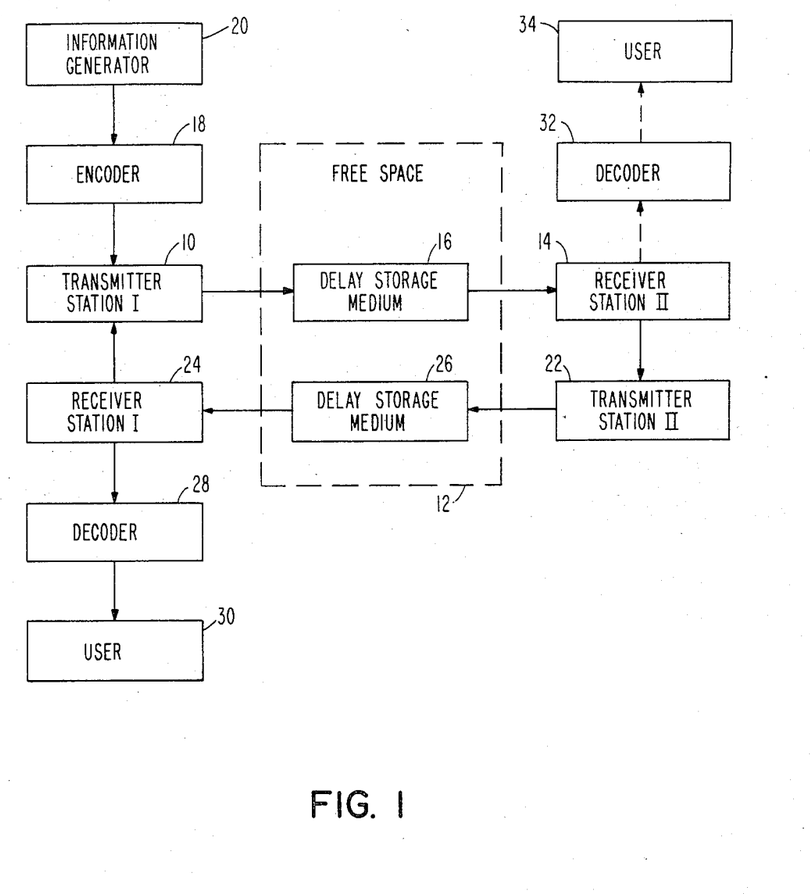
FIG. 1 is a simplified block diagram of a space memory system.

FIG. 1 illustrates what may be considered as being a rather basic layout of a time-delay space memory. A first transmitter 10 is provided with an antenna or other radiator to launch electromagnetic radiation away from its location on Earth outwardly into free space as herein arbitrarily designated by the area 12. Located at the opposite side of free space 12 is a receiver 14 of the same electromagnetic radiation as sent by transmitter 10. Free space 12 constitutes a delay storage medium 16 for propagation of the electromagnetic signal derived from the output of transmitter 10.

As herein exemplified, the carrier emitted from transmitter 10 has a frequency measured in the gigahertz range. Transmitters operating with a carrier at such a frequency are readily available. Nevertheless, the carrier produced by transmitter 10 could have a significantly different frequency. For example, communications with satellites orbiting the Earth in free space are regularly achieved using frequencies below thirty megahertz. At the other extreme, communication has been achieved between the Earth and a satellite at frequencies within the range of light. Thus, the particular frequency at which transmitter 10 operates and receiver 14 accepts is not of limiting importance, although the particular frequency selected desirably may be made in view of well-understood considerations of bandwidths available, allocated assignments and freedom from interference by atmospheric conditions present on the earth or, possibly, at the remote location of receiver 14.

In any event, the carrier (or carriers) emitted by transmitter 10 is encoded or modulated by an encoder 18 with information received from a generator 20. Generator 20 may be any source of data. It could, for example, be the output from a video camera as it scanned the text of a court opinion, a page from a merchandise catalog or a list of inventory. While such information could be presented in analog form, it is preferred to take advantage of the present state of the art in information processing and present the information in a digital format. Thus, information generator 20 desirably might be the output of a computer in which information previously had been stored after having been, perhaps, manipulated.

As indicated, encoder 18 modulates the information on the carrier developed by transmitter 10. Again, the manner of modulation can be of any known mode ranging from a simple "on" and "off" of the carrier through any of the various different modes of pulse modulation and even to versions of frequency or amplitude modulation. For the purpose of conserving spectral usage, it clearly is preferred to employ presently-known modulation techniques that take maximum advantage of digital techniques and multiplexing as now conventionally employed in satellite communication.

Coupled to receiver 14 at the remote location is another transmitter 22 which receives the information accepted by receiver 14. Transmitter 22 redirects that information by means of its carrier which is transmitted back through space 12 to still another receiver 24. As between transmitter 22 and receiver 24, space 12 once again affords a delay storage medium 26. Receiver 24 feeds an output of the information it accepts back to transmitter 10. Each receiver modulates or encodes its associated transmitter in the same manner as hereinabove described with regard to encoder 18.

It will thus be seen that transmitter 10, receiver 14, transmitter 22 and receiver 24, together with delay storage mediums 16 and 26, establish a continuously-flowing loop of electromagnetic energy which extends through free space from one location to another. As illustrated, all elements of the loop would operate at the same frequency of electromagnetic radiation and all modulation techniques would be consistent. Should other considerations dictate that any link in the system employ a different frequency of propagated signal or a different mode of modulation technique, a countering or compensating change must be introduced into the loop, so that the information itself is enabled to flow in a continuous loop and be delayed by mediums 16 and 26.

A decoder 28 monitors the information passing through receiver 24 and decodes that information which is fed to a user device 30. User device 30 is any kind of apparatus that is capable of manipulating the received information for a meaningful purpose. That would, of course, include a video display, a printer or the input of a computer. Analogously, a decoder 32 and a user device 34 may be located at the remote location for deriving and presenting signals being processed through receiver 14.

Figure 2:
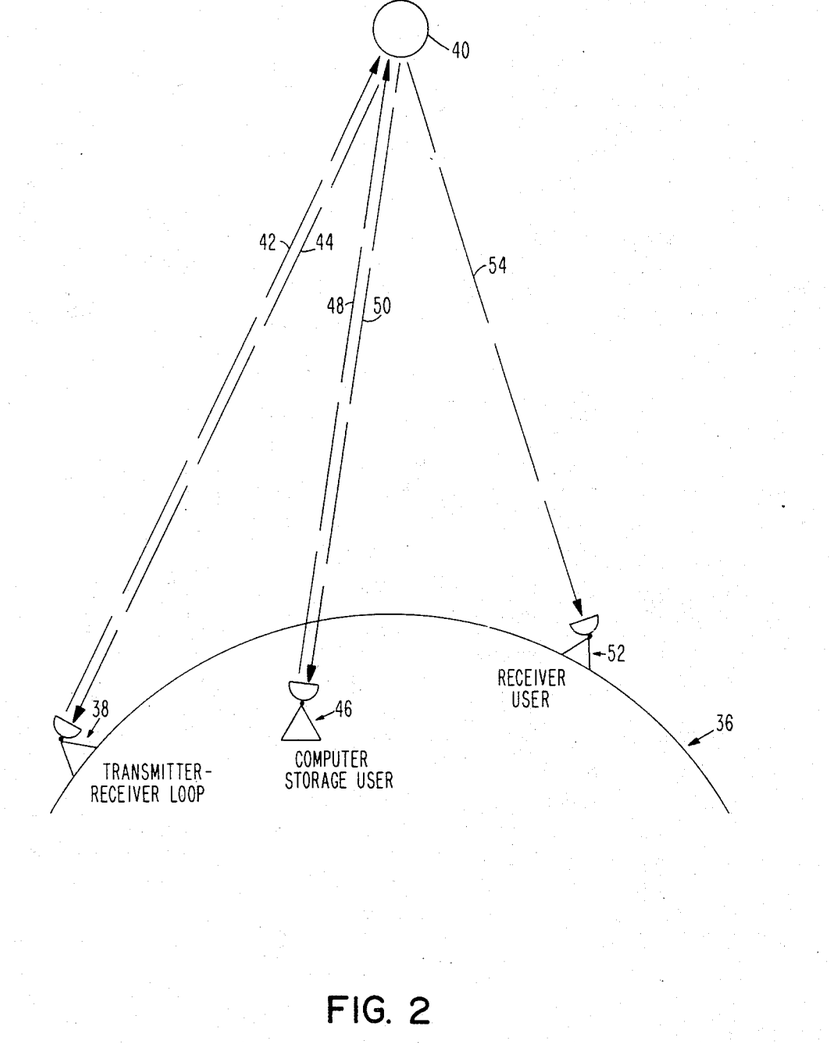
FIG. 2 is a diagram illustrating one manner of implementing the system of FIG. 1.

FIG. 2 illustrates as a first object the planet Earth 36 upon the surface of which is located a site 38 at which at least transmitter 10 and receiver 24 are located. Outwardly from the Earth and in free space is a second object 40, such as a satellite or planetary body, on which receiver 14 and transmitter 22 are located. For the purpose of initial explanation, it may be assumed that object 40 is the Moon of planet Earth, although that would not be preferred for the specific arrangement of FIG. 2 because the Moon is not geo-synchronous with its planet. The air and free space between objects 36 and 40 serve as delay-storage mediums 16 and 26. The signal radiated from site 38 traverses a path 42 which extends to object 40 and from which it is re-radiated along a path 44 back to site 38. It is paths 42 and 44 which constitute the delay media.

Situated elsewhere on Earth 36 is what may be termed a computer storage user 46 of the system. User 46 has its own transmitter capable of directing a modulated electromagnetic signal along a path 48 to object 40, as well as for receiving signals directed back from object 40 to user 46 along a path 50. In this arrangement, user 46 may interrogate a receiver 14' at object 40 by sending a suitable command signal along path 48 and receive back from a transmitter 22' at object 40 and along path 50 a retrieval of information stored at any given point along the loop established by paths 42 and 44. Receiver 14' and transmitter 22' may be incorporated into receiver 14 and transmitter 22 or be separated and made a part of user device 34. Known security techniques may be employed within remote receiver 14, so as to preclude the possibility of returned transmission along path 50 unless a properly-identifying cryptographically-selected code has been received.

Still another aspect of possible use is illustrated by a receiver user 52 located on the surface of Earth 36. User 52 has only a receiver for the radiation concerned as directed from a transmitter 22" along a path 54 from object 40. Again, transmitter 22" may be part of transmitter 22 or an entirely separate part of user device 34. Thus, user 52 is enabled to receive any information broadcast from object 40 by transmitter 22" that is not encoded for special security. For this kind of use, it is preferred that the signal from transmitter 22" at remote object 40 be broadcast by an antenna system of comparatively broad angle of pattern of radiation, so as to accommodate distribution of the radiated signal over a wide angle of the presented surface of Earth 36. As a consequence, a variety of receiver users 52 could be scattered over the facing surface of Earth 36, all able to receive the same information transmitted from object 40.

It will be observed that essentially line-of-sight transmission is contemplated. With transmission by means of electromagnetic energy, the time delay involved in any of the illustrated paths is equivalent to the distance of separation involved divided by the velocity of light which is approximately one-hundred-eighty-six thousand miles per second. Changing the example to the use of a remote object 40 having a separation of 1.86 million miles from Earth 36, the resulting propagation delay is ten seconds. Also assuming a data cell that is twenty-five nanoseconds in length, it will be discerned that a total of forty-million bits of information may be transmitted during each second of time. In just ten seconds of delay, therefore, there is effective availability in free space for the storage of four-hundred-million bits of data as between Earth 36 and object 40.

The apparatus on object 40 acts as a transponder. As shown in FIG. 1, it is composed of both receiver 14 and transmitter 22. In the alternative, there may simply be a reflector of the radiated energy on the remote object. In either case, the apparatus acts as a relay of the information in path 42 back along path 44. The additional existence of return path 44 doubles the delay, and hence the amount of data which may be stored, for a given spacing between Earth 36 and object 40. Thus, in this example, a total of eight-hundred-million bits of data may be stored. Yet, the maximum access time is only twenty seconds. When such data has been loaded into the loop, it is possible to recycle the data indefinitely without any need for further encoding. At the same time, the data may be accessed without, in any way, interfering with the storage.

The overall storage capacity of the system may be increased by increasing the distance between any two locations, by increasing the number of locations used in a manner to further the distance or by increasing the number of transmitters and receivers located effectively at each location as by utilizing slightly different frequencies or by adopting other means of multiplexing. While FIG. 2 illustrates a basic example of one station located on Earth communicating with another station at object 40 which may be a satellite, it is to be observed that, not only may any particular station be either active or passive, it may be situated essentially anywhere, including on the Moon or the Earth, on one of the planets in the solar system or its moon, on a satellite of Earth or on a satellite located anywhere in the universe. The greater the distance between the two locations, the greater is the storage capacity.

It will also be observed that the systems under discussion are capable of implementation with use of currently available hardware. Satellites of the Earth are now in common use for the communication of telephone conversations, television programs and other messages. The only basic difference in implementation as compared with that which now exists is the completion of a loop of information flow so as to achieve time-delay space memory.

The programmed storage in the system of FIG. 1 is subject to destruction by failure of any particular essential element in the loop. Because there is no cost for the storage medium, however, and the hardware available for use at each end of the storage loop now is readily available, it is highly desirable to include parallel or redundant elements in the loop.

Figure 3:
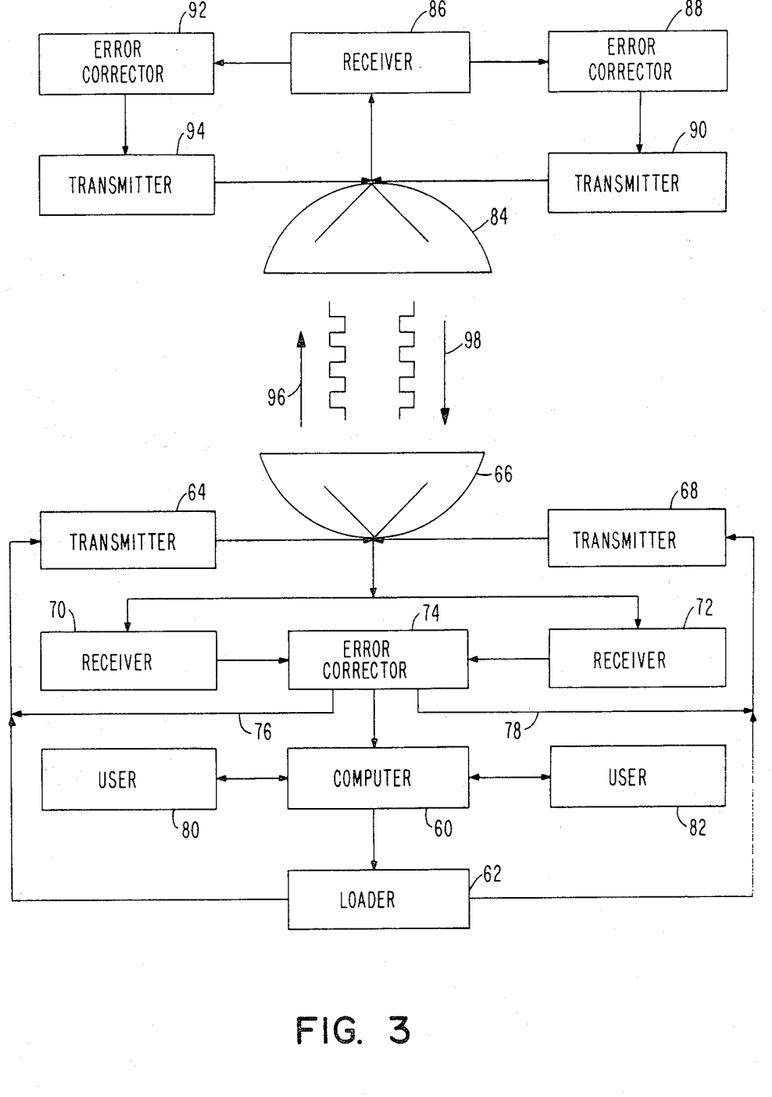
FIG. 3 is a block diagram of a more detailed form of the system shown in FIG. 1.

Such a system is illustrated in FIG. 3 which also represents an embodiment of the overall system for use as a computer data storage medium. Thus, a computer 60, programmed to manipulate data, is coupled to feed information to a loader 62 which encodes or modulates a transmitter 64 that feeds an antenna 66 directed toward the space-linked remote object. At the same time, loader 62 also supplies the information to a second or redundant transmitter 68 which feeds the same information in parallel to antenna 66.

Receiving and accepting energy from antenna 66 is a first receiver 70 and a second, redundant, receiver 72. Both receivers provide signals to an error corrector 74 that processes the received data stream in a known manner to account for and adjust distorted bits of information. Corrector 74 may include its own redundancy. Appropriate correction signals are fed from corrector 74 back to transmitters 64 and 68 by means of respective lines 76 and 78. The corrected output derived from corrector 74 also is returned to computer 60 as an input. A plurality of users 80 and 82 are coupled to computer 60 either for accessing the same with informational input or retrieving information therefrom.

Antenna 66 is electromagnetically coupled through free space to a remote antenna 84 located on a satellite or the like. Antenna 84 is connected through a receiver 86 to a first error corrector 88 which is coupled to a transmitter 90 that, in turn, feeds back to antenna 84. Receiver 86 also supplies another error corrector 92 which is coupled to a transmitter 94 that, in turn, also feeds antenna 84. Redundancy likewise may be included in receiver 86.

As in FIG. 1, the total system of FIG. 3 establishes a communications link along a first path 96 leading outwardly and a second return path 98. Thus, paths 96 and 98 represent a delay storage medium in what amounts to a round-trip loop between earth and a remote satellite or the like, and it may be assumed that antenna 84 is located on a satellite which is in geo-synchronous orbit about Earth. The earth station, including its redundant transmitters and receivers as well as its data-error-correcting circuitry, is set up so that it is in communication with the satellite station on which antenna 84 is located and which includes its own redundant transmitter and receiver features as well as additional data-error-correcting circuitry. As explained in connection with FIG. 2, antenna 84 at the remote site, or a sister antenna coupled into the system, preferably is designed to provide wide-area coverage when transmitting back to earth.

The arrangement described allows data, which may be of an entirely arbitrary nature although preferably encoded previously in such a manner as to facilitate synchronization of error correction, to be made available to the different transmitters by loader 62. Using, for example, direct memory access techniques, the data are inserted into the free-space storage-data stream 96 between the two antennas. In the particular configuration of a geo-synchronous satellite of Earth, the average propagation time for a round trip between Earth and the satellite is approximately 0.25 second. Again assigning twenty-five nanoseconds per data cell and allowing for encoding overhead to accommodate synchronization and error-correction according to standard technology, the total free-space storage is effectively 6.4 million bits.

In an eight-bit system which normally is adequate for information processing, the latter amounts to eight-hundred-thousand bytes. It may be noted that this is approximately equivalent to three times the storage on a single side of a conventionally-formatted floppy disc. The average access time for retrieving data is approximately 0.125 second. The data file could be structured with fixed-length records to facilitate access to coded subgroups within the data file. Each record within such a data file could contain its own unique identification information.

Using existing technology, it is feasible at the present state of the art to employ up to approximately ten-thousand channels for the purpose of data storage. Note that each channel is its own space memory having the characteristic of storage of 6.4 million bits of information in the example using Earth and a satellite geo-synchronous therewith. The amount of total storage thus available, again using only present-day hardware, is astounding. It has been estimated that the system described might accommodate all information which is now stored in the book libraries of the United States of America.

Figure 4:
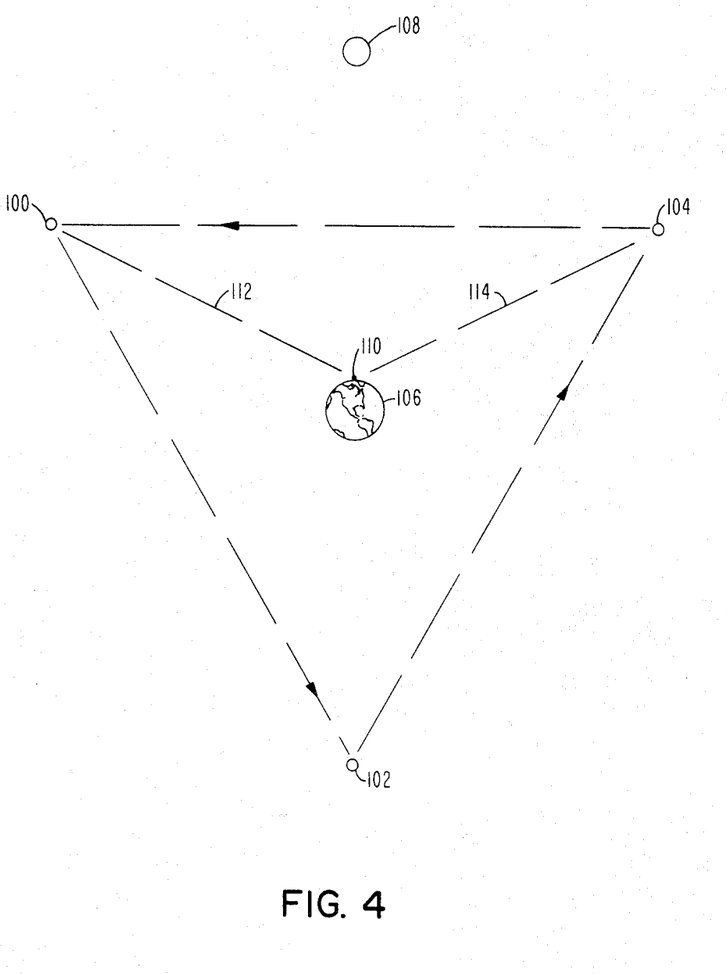
FIG. 4 is a diagram depicting one mode of extending capability of the system depicted in FIG. 2.

Despite the tremendous capability, in terms of bits of storage, of the system as thus far explained, it may be expanded further to embrace many orders of magnitude of additional storage. With reference to FIG. 4, observe the use of three earth-satellites 100, 102 and 104 placed at the corners of an equilateral triangle which encompasses Earth 106 with a separation of each satellite from Earth at a distance of approximately two-hundred-fifty-thousand miles. One known means of implementing such a configuration of satellites is to use the Langragian points to allow two of those satellites to maintain stable orbits sixty degrees before and sixty degrees after, respectively, of Earth's moon 108 and in a manner similar to the relationship between the sun, Jupiter and the Trojan group of asteroids. On Earth 106 is a transmitting and receiving station 110 capable of transmitting to and receiving from either satellite 100 or satellite 104 respectively along either a path 112 or a path 114. A signal delivered from station 110 to remote site 100, for example, is caused to be transmitted in sequence along a path extending from satellite 100 to satellite 102, from satellite 102 to satellite 104 and then back to satellite 100. The average propagation time in this configuration for one round trip as between the three satellites is approximately seven seconds. Again at twenty-five nanoseconds per data cell, the total storage capacity is approximately twenty-two-million bytes of information. Assuming a requirement of four-thousand bytes to represent all characters and spacing on a page of text, it will be observed that each discrete channel of one-hundred kilohertz bandwidth of free-space storage may accommodate five-thousand-five-hundred pages of text. Average access time in this configuration is approximately three and one-half seconds, delay time incurred between the coupled satellite and Earth being transparent to the passive user. Because such an arrangement of three satellites are spaced one-hundred-twenty degrees with respect to each other in their triangle, they together serve to provide total coverage of Earth for purposes of communication between any Earth station and at least one of the different satellites.

Figure 5:
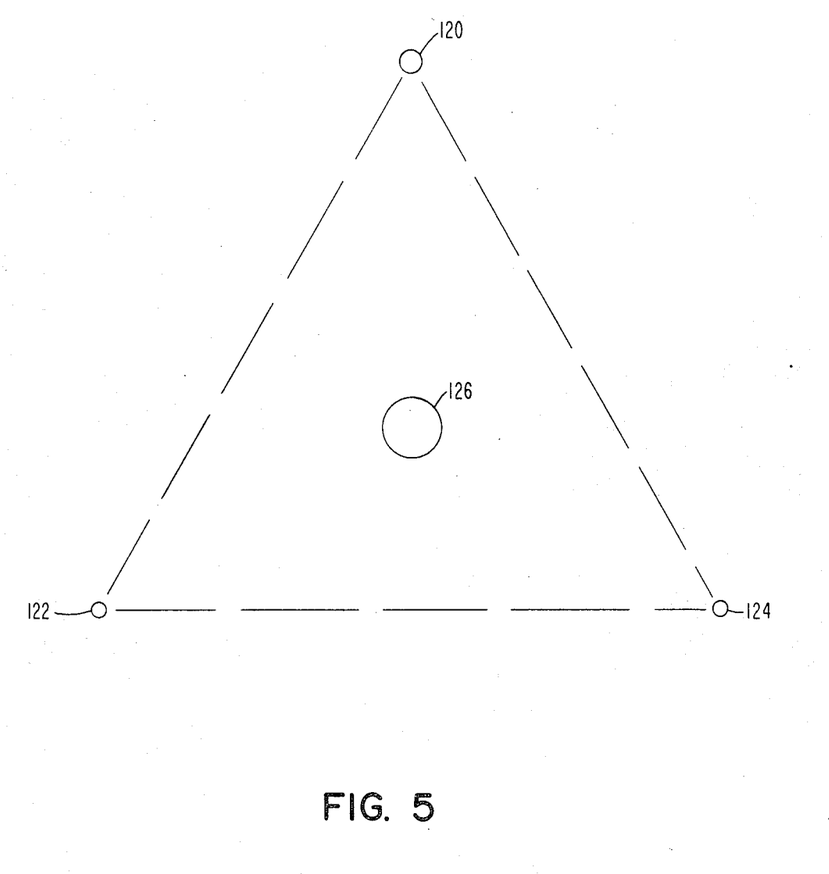
FIG. 5 is a diagram representing an alternative mode of such extension.

Expanding further upon the concept of time-delay space storage, FIG. 5 illustrates the location of Earth at 120 and satellites 122 and 124 in equiangular positions about Earth's sun 126 and at the respective Langragian positions relative to the earth-sun system. Thus, each is situated in either a leading or a lagging position of one-hundred-twenty degrees relative to Earth in its own orbit. Such an arrangement provides a space between the earth and each of the satellites of approximately ninety-three-million miles, or one-hundred-eighty-six million miles in the loop defined by Earth and either one of satellites 122 and 124. The propagation time necessary to traverse just that loop is approximately one-thousand seconds. At twenty-five nanoseconds per data cell, the total storage capacity now becomes approximately 25.6 times $10^9$ bits per discrete channel, or three-billion bytes per channel. Again assuming four-thousand bytes per page of text, each discrete channel of free space storage will accommodate seven-hundred-and-fifty-thousand pages of text. Considering that the electromagnetic spectrum in deep space is unused, and also observing that directivity of transmission and reception between the different satellites could be discrete, it will be seen that present day technology enables the use of a great many channels. Accordingly, some ten-thousand channels in the loop system may provide enough storage for thirty-million books of average length of two-hundred-fifty pages each. Yet, the typical access time would only be five-hundred seconds.

These illustrations of storage capability are intended to be meaningful in terms of actual use. The representative twenty-five nanosecond data cell duration specified in several examples represents forty million bits of information transmitted per second. Considering presently available techniques of information processing, not all of those bits are, of course, usable. In accordance with the art, a certain number are allotted to error correction, clock synchronization and addressing. It is a common technique in the art to use a discrete carrier frequency that is turned on and off so as to represent ones and zeros. More efficient use of the spectrum, and correspondingly more efficient data transfer, can be obtained by allowing a signal transition of the carrier, either from off to on or on to off, to represent a binary one. Those binary "ones" also can be used to synchronize a receiver system clock. However, a long series of successive zeros could cause a clock system to drift. It is, therefore, contemplated for application in this system to use a magnetic recording technique commonly known as group code recording (GCR). In this technique, each four-bit group of data is mapped into five bits, using a fixed assignment which guarantees that the coded data stream never contains more than two consecutive zeros. That encoding technique results in an effective reduction in the informational data rate of twenty percent. Thus, the effective data rate is reduced in this example to approximately thirty-two-billion bits per second.

Noise and other phenomena also contribute to a random loss of data bits which must be accounted for in what is called the encoding overhead. To assist in correcting such random data errors, it is a common practice to insert error checking and error correction characters in the data stream. It is for this reason that error correctors 74 and 88 are included in the system as illustrated in FIG. 3. One technique known for such a purpose is to include in the data stream a "polynominal remainder". Another approach is to insert longitudinal and latitudinal parity information into the data stream. That parity information can then be used by the receiving terminals to correct a number of data errors.

Normally, these different correction techniques result in the inclusion of about one correction byte for every four bytes of informational data. Considering this limitation and the previously discussed accommodation to practice by means of the inclusion of a GCR mapping factor, the effective data information rate for the system is again reduced by about twenty percent so as to yield an end result of a data cell duration of approximately 25.6 million bits per second. It will be observed that this data rate is most useful and, calculated on the basis of twenty-five nanoseconds per data cell, fully enables the use of existing technology in the control logic and hardware-memory portions associated with the disclosed system. Existing metal oxide and bipolar technologies are compatible for use in the electronic circuitry. Furthermore, the space memory disclosed may be loaded by the use of available direct memory access techniques.

On reflection, it will be seen that underlying concepts of the present invention involve the substitution of distance for the increased informational-bit packing densities heretofore only recognized to be available with comparatively low-frequency transmission at slow propagation speeds. In contrast to the latter, the disclosed systems enable the use of high-speed propagation with carriers at frequencies which enable the modulation or encoding upon a given carrier of an enormous amount of information. Information to be stored and later retrieved could be strictly of a factual nature, involving anything ranging from the listings in a telephone directory to master lists that would represent an encyclopedia in any given field. A second type of information desirably to be placed in the disclosed system would be programs that are to be used by earth-bound computers. This approach amounts to a tremendous extension of the memory capacity of any local computer, allowing given users of their own quite-limited computers to have the advantage of an almost unlimited memory. A third type of information contemplated to be stored in the system would represent a combination of the first two types just discussed. The ultimate user would be able to combine as desired stored factual information and software programs. At the same time, portions or certain types of information may be encrypted to allow only limited access, such as only by subscribers or those authorized to satisfy a need to know.

Generally, the above discussion has assumed that Earth is involved one way or another as what might be termed a base station which also is located at one end of a delay loop that may, in turn, be linked sequentially with other delay loops. In principle, however, any communcation link with Earth need not be used in itself for system storage.

It has been indicated that a synchronous or fixed relationship between spaced objects is preferred. Nevertheless, a non-synchronous satellite or the moon could be used with or without association with still another satellite. Of course, that could limit access and storage intervals. On the other hand, a plurality of earthbound stations could be otherwise linked together and so distributed that at least one always was in sight of the space-linked remote object.

The amount of storage desirably is maximized by taking advantage of the large distances and unused spectrum available in free space. Yet, a sufficient degree of storage for some purposes may otherwise be made available. For example, a high-velocity spectrally-wide electromagnetic propagation loop could be established within an evacuated or gas-filled structure which also might serve some other purpose. Further development of long-distance communications techniques entirely within the atmosphere of Earth could ultimately allow the use of a reliable loop which encircled Earth repeatedly. Notwithstanding these possibilities, it is the addition of what might be called "spaceware" which enables the attainment of storage increased in amount by orders of magnitude over that presently available. In itself, the storage medium costs nothing, and its implementation requires only hardware and software that already are available.

While particular embodiments of the invention have been shown and described, and various alternatives have been taught, it will be obvious to those skilled in the art that changes and modifications may be made without departing from the invention in its broader aspects. Therefore, the aim in the appended claims is to cover all such changes and modifications as fall within the true spirit and scope of the invention.

I claim:

1. A data storage system comprising:
    a first transmitter of first data-carrying electromagnetic radiation located on a first object having a determinable position in space;
    a first receiver of second data-carrying electromagnetic radiation located on said first object;
    a second transmitter of said second radiation located on a second object having a determinable position moving in a predetermined orbit in outer space free of the earth's atmosphere and removed from said first object by a distance creating substantial delay in propagation of said first and second radiation through said outer space between said first and second objects;
    a second receiver of said first radiation located on said second object;
    means for directing said first and second radiation respectively from said first transmitter to said second receiver and from said second transmitter to said first receiver through said space;
    means for coupling externally-derived intelligence-representing data encoded on said radiation from said first receiver to said first transmitter and from said second receiver to said second transmitter, said receivers and transmitters together with said coupling means and propagation space between said objects establishing a continuously recirculating loop of said data which loop extends between said first and second objects;
    means for encoding said data into said loop for storage therein;
    means for extracting said data from said loop after storage therein by repeated recirculation;
    said first object being the planet earth; and
    in which said directing means broadcasts said first radiation in a confined narrow beam from said first transmitter to said second receiver but broadcasts said second radiation from said second transmitter in a diverging beam which subtends a wide angle that spreads said second radiation over a substantial geographical area of said planet Earth, said wide angle being of a magnitude sufficient to cover a plurality of spaced geographical locations on said planet.

2. A data storage system comprising:
    a first transmitter of first data-carrying electromagnetic radiation located on a first object having a determinable position in space;
    a first receiver of second data-carrying electromagnetic radiation located on said first object;
    a second transmitter of said second radiation located on a second object having a determinable position moving in a predetermined orbit in outer space free of the earth's atmosphere and removed from said first object by a distance creating substantial delay in propagation of said first and second radiation through said outer space between said first and second object;
    a second receiver of said first radiation located on said second object;
    means for directing said first and second radiation respectively from said first transmitter to said second receiver and from said second transmitter to said first receiver through said space;
    means for coupling externally-derived intelligence-representing data encoded on said radiation from said first receiver to said first transmitter and from said receivers and transmitters together with said coupling means and propagation space between said objects establishing a continuously recirculating loop of said data which loop extends between said first and second objects;
    means for encoding said data into said loop for storage therein;
    means for extracting said data from said loop after storage therein by repeated recirculation;
    at least one additional combination of transmitter and receiver of third data-carrying electromatic radiation located on a third object having a determinable position in outer space free of the earth's atmosphere and removed from said first and second objects by distances creating substantial delay in propagation of radiation therebetween, and in which said additional combination is included in said loop to increase time of data flow therein.

3. A data storage system as defined in claim 2 which also includes at least one further said combination disposed to establish with said second and third objects a triangle-defining pattern of remote satellites orbiting said first object.

4. A data storage system as defined in claim 2 in which said first object is the planet Earth and in which said second and third objects together with said planet establish a triangle-defining pattern of objects orbiting the Sun of said first object.

5. The method of storing data which comprises:
    establishing a first flow of energy from the planet earth to a first object separated therefrom by outer space free of the earth's atmosphere and moving in a predetermined orbit;
    establishing a second flow of energy from said first object to said planet through said space;
    loading externally-derived intelligence-representing data onto one of said first and second energy flows;

deriving said data from said one energy flow and loading the derived data onto the other of said first and second energy flows;

re-deriving said data from said other energy flow and re-loading the rederived data onto said one energy flow, thereby establishing a continuously recirculating loop of said data extending between said planet and said object;

extracting said data from said loop after storage therein by repeated recirculation;

said method further including the transmission of said data in an extention of said loop to circulate through a second object orbiting in outer space free of the earth's atmosphere and separated in said outer space from said planet and said first object.

6. The method of storing data which comprises:

establishing a first flow of energy from the planet earth to a first object separated therefrom by outer space free of the earth's atmosphere and moving in a predetermined orbit;

establishing a second flow of energy from said first object to said planet through said space;

loading externally-derived intelligence-representing data, onto one of said first and second energy flows;

deriving said data from said one energy flow and loading the derived data onto the other of said first and second energy flows;

re-deriving said data from said second energy flow and reloading the re-derived data onto said first energy flow, thereby establishing a continuously recirculating loop of said data extending between said planet and said object;

extracting said data from said loop after storage therein by repeated recirculation; and in which said first and second energy flows individually are at respectively different frequencies.

7. The method of storing data which comprises:

establishing a first flow of energy from the planet earth to a first object separated therefrom by outer space free of the earth's atmosphere and moving in a predetermined orbit;

establishing a second flow of energy from said first object to said planet through said space;

loading externally-derived intelligence-representing data onto one of said first and second energy flows;

deriving said data from said one energy flow and loading the derived data on to the other of said first and second energy flows;

re-deriving said data from said other energy flow and reloading the re-derived data onto said one energy flow, thereby establishing a continuously recirculating loop of said data extending between said planet and said object;

extracting said data from said loop after storage therein by repeated recirculation; and directing said first flow of energy from said planet to said object in a confined narrow beam and directing said second flow of energy from said object in a diverging beam which subtends a wide angle over a substantial geographical area of said planet, said wide angle being of a magnitude sufficient to cover a plurality of spaced geographical locations on said planet.

8. The method of storing data which comprises:

establishing a first flow of energy from the planet earth to a first object separated therefrom by outer space free of the earth's atmosphere and moving in a predetermined orbit;

establishing a second flow of energy from said first object to said planet through said space;

loading externally-derived intelligence-representing data onto one of said first and second energy flows;

deriving said data from said one energy flow and loading the derived data onto the other of said first and second energy flows;

re-deriving said data from said one energy flow and reloading the re-derived data onto said one energy flow, thereby establishing a continuously recirculating loop of said data extending between said planet and said object;

extracting said data from said loop after storage therein by repeated recirculation;

establishing a third flow of energy between (a) one of said planet and said first object and (b) a second object located in a determinable position in outer space free of the earth's atmosphere and removed from said planet and said first object by distances creating substantial delay in flow of such energy therebetween;

establishing a fourth flow of energy between (a) the other of said planet and said first object and (b) said second object;

extracting said data from said one energy flow and reloading the extracted data onto one of said third and fourth energy flows; and re-extracting said data from the other of said third and fourth energy flows and reloading the re-extracted data onto the other of said first and second energy flows, thereby including said third and fourth energy flows in said loop to increase time of data flow therein.

9. A method as defined in claim 8 which still further includes:

developing one additional pair of energy flows to and from a third object in a determinable position in outer space free of the earth's atmosphere and removed from said planet and said first and second objects by distances creating substantial delay in flow of such energy therebetween, said objects being remote satellites orbiting said planet and together defining a triangular pattern surrounding said planet; and including said additional energy flows in series in said loop to further increase time of data flow therein.

10. A method as defined in claim 8 in which said first and second objects together with said planet establish a triangle-defining pattern orbiting the Sun of said planet.

* * * * *